United States Patent
Mochizuki et al.

(10) Patent No.: US 8,395,765 B2
(45) Date of Patent: Mar. 12, 2013

(54) WAVELENGTH MONITOR

(75) Inventors: Keita Mochizuki, Tokyo (JP); Hiroshi Aruga, Tokyo (JP); Atsushi Sugitatsu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/315,678

(22) Filed: Dec. 9, 2011

(65) Prior Publication Data
US 2012/0147361 A1 Jun. 14, 2012

(30) Foreign Application Priority Data
Dec. 13, 2010 (JP) .................................. 2010-277508

(51) Int. Cl.
*G01J 1/42* (2006.01)

(52) U.S. Cl. ....... 356/218; 385/88; 385/94; 250/227.23; 250/227.11

(58) Field of Classification Search .................. 356/218, 356/128–137; 250/227.23, 227.11; 385/88, 385/94; 359/577, 135, 180
See application file for complete search history.

(56) References Cited

U.S. PATENT DOCUMENTS

| | | | | | |
|---|---|---|---|---|---|
| 5,754,322 | A | * | 5/1998 | Ishikawa et al. | 398/98 |
| 6,678,432 | B2 | | 1/2004 | Shigeta et al. | |
| 6,813,420 | B1 | * | 11/2004 | Korn | 385/52 |
| 6,915,035 | B2 | | 7/2005 | Iwafuji | |
| 7,027,470 | B2 | * | 4/2006 | May | 372/20 |
| 2004/0151440 | A1 | * | 8/2004 | Flanders et al. | 385/88 |

FOREIGN PATENT DOCUMENTS

| | | |
|---|---|---|
| JP | 2002-171023 | 6/2002 |
| JP | 2002-185074 | 6/2002 |
| JP | 2003-163411 | 6/2003 |
| JP | 2007-157937 | 6/2007 |

* cited by examiner

*Primary Examiner* — Sang Nguyen
(74) *Attorney, Agent, or Firm* — Oblon, Spivak, McClelland, Maier & Neustadt, L.L.P.

(57) ABSTRACT

In a wavelength monitor that monitors a wavelength of laser light emitted from at least two semiconductor lasers formed in parallel on a semiconductor substrate, the wavelength monitor includes a collimating lens that collimates laser light from each of the semiconductor lasers, an etalon that is arranged so that laser light collimated by the collimating lens is capable of entering and has a periodicity, and a photodetector that receives laser light transmitted through the etalon and detects a light intensity, wherein a beam propagation angle in the etalon of laser light emitted from each of the semiconductor lasers becomes a predetermined angle obtained by formula 1.

14 Claims, 5 Drawing Sheets

WAVELENGTH MONITOR

BACKGROUND OF THE INVENTION

1. Field of the Invention

The present invention relates to a wavelength monitor.

2. Description of the Related Art

Recently, in the field of optical communications, with the increase in speed and capacity in an optical transmission system, the Wavelength Division Multiplexing (WDM) system for performing optical multiple transmission with one optical fiber has become widespread as a core technology thereof. For performing a stable management, this WDM system needs to ensure a preparatory signal light source having the same oscillation wavelength in case of unexpected stoppage of a signal light source, which increases the maintenance cost. For suppressing this cost, a demand for an optical wavelength-variable light source capable of outputting laser light of a plurality of wavelengths by one signal light source has been increasing.

It is required for the wavelength-variable light source that the wavelength of an optical signal is stable over a long period of time, so that a light source having a function of a wavelength monitor, which monitors light emitted from a semiconductor laser, has been developed. As a representative wavelength-variable light source, a system in which the oscillation wavelength is made tunable by changing the temperature of the semiconductor laser is proposed. The tunable width of the oscillation wavelength of the semiconductor laser in this system is determined based on the operating temperature range and is only about 2 to 3 nm, so that a structure in which a plurality of semiconductor lasers are provided is often used for increasing the wavelength-variable width.

As a typical conventional technology relating to the wavelength monitor of the wavelength-variable light source, a structure is proposed in which emitted light (hereinafter may be referred to just as "exit light") in the backward direction from a plurality of semiconductor lasers is multiplexed into one waveguide in an optical multiplexer, and the light, which is emitted from one port and is output to an optical fiber, is split by a beam splitter or the like to be partially used for the wavelength monitor (for example, Non-patent documents 1, 2, and 3, which are Japanese Patent Applications Laid-Open NO. 2002-185074, 2007-157937 and 2002-171023, respectively).

Moreover, a structure of using exit light in the backward direction from a plurality of semiconductor lasers for a wavelength monitor is proposed (for example, Non-patent documents 3 and 4, wherein document 4 is Japanese Patent Application Laid-Open No. 2003-163411).

However, there are following problems in the above conventional technologies. In the conventional method (for example, Non-patent documents 1, 2, and 3) of performing the wavelength monitoring by using the forwardly emitted exit light, a part of the light to be output to the optical fiber is split for monitoring the wavelength, so that the output power from the wavelength-variable light source decreases. Moreover, because an optical component such as the beam splitter is needed, the size of the whole wavelength-variable light source increases and accordingly the cost increases.

In the conventional method (for example, Non-patent document 4) of performing the wavelength monitoring by using exit light in the backward direction, although the above problems are solved, a point at which light is emitted from a semiconductor substrate (hereinafter may be referred to just as an "exit portion") is different for each semiconductor laser, so that a variation in the wavelength monitoring characteristics due to an angle of incident on a filter and an incident position on the filter is a problem. For example, in Non-patent document 4 described above, exit light is guided to a position in a range in which the light to be monitored can enter by providing a backward optical waveguide, which guides the backwardly emitted exit light from a plurality of semiconductor lasers to a narrow area at the rear end of a semiconductor chip, to the semiconductor chip. However, the actual light exit positions are all different, so that a propagation angle of collimated light after transmitting through a collimator lens changes depending on the eccentricity of each light emission point seen from the collimator lens provided in the backward direction of the semiconductor chip. The frequency periodicity of the transmittance of the filter depends on the incident angle of light, so that the relationship between the light intensity of exit light from each semiconductor laser detected by a photodetector and the frequency of light becomes different, which degrades the monitoring accuracy of the wavelength of light.

SUMMARY OF THE INVENTION

It is an object of the present invention to at least partially solve the problems in the conventional technology.

A wavelength monitor according to one aspect of the present invention, which monitors a wavelength of laser light emitted from at least two semiconductor lasers formed in parallel on a semiconductor substrate, is constructed in such a manner that it comprises: a lens that collimates laser light from each of the semiconductor lasers; a filter that is arranged so that laser light collimated by the lens is capable of entering and has a periodicity; and a photodetector that receives laser light transmitted through the filter and detects a light intensity, wherein an intra-filter beam propagation angle of laser light emitted from each of the semiconductor lasers becomes a predetermined angle obtained by the following formula:

$$\theta_k = \arccos\left(\frac{m_k c}{2n_\lambda L_{etalon} f}\right)\left(\approx \sqrt{2\left(\frac{2n_\lambda L_{etalon} f}{m_k c} - 1\right)}\right)$$

where f indicates an arbitrary peak frequency, $m_k$ indicates an order of interference which is an arbitrary natural number for each k, c indicates a light speed, $n_\lambda$ indicates a refractive index of the filter at a wavelength $\lambda$, $L_{etalon}$ indicates a length of the filter, and $\theta_k$ indicates an intra-filter light beam propagation angle (rad) of laser light emitted from a k-th semiconductor laser.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Embodiments of a wavelength monitor according to the present invention are explained below in detail based on the drawings. This invention is not limited to these embodiments.

First Embodiment

Figure 1:
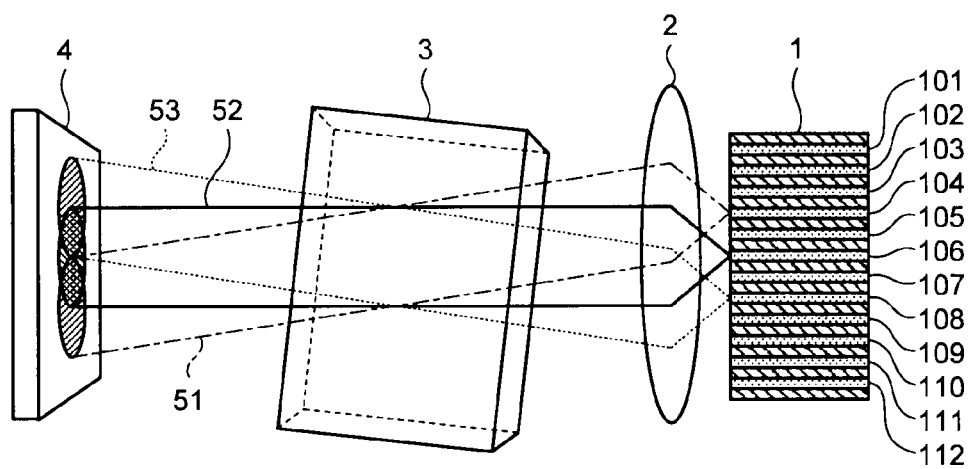
FIG. 1 is a diagram illustrating a configuration of a wavelength monitor according to a first embodiment of the present invention.

FIG. 1 is a diagram illustrating a configuration of a wavelength monitor according to the first embodiment of the present invention. The wavelength monitor according to the present embodiment is provided in a wavelength-variable optical module (not shown) capable of changing the wavelength of exit light, and includes a semiconductor substrate 1, two or more semiconductor lasers 101 to 112 formed in parallel on the semiconductor substrate 1, a collimating lens 2 that collimates diffusion light emitted from the semiconductor lasers 101 to 112 into parallel light, a filter (for example, an etalon 3) that is arranged in the backward of the semiconductor substrate 1 so that collimated light transmitted through the collimating lens 2 enters and has a periodic frequency dependence of the transmittance, and a photodetector 4 that receives light transmitted through the etalon 3 and detects the light intensity thereof.

In FIG. 1, as one example, a beam path 51 of a beam emitted from the semiconductor laser 104, a beam path 52 of a beam emitted from the semiconductor laser 106, and a beam path 53 of a beam emitted from the semiconductor laser 108 are conceptually illustrated.

In the wavelength monitor according to the present embodiment, the semiconductor lasers 101 to 112 are unequally spaced such that beam propagation angle $\theta_k$ within an etalon 3 (hereinafter may be referred to just as "intra-etalon beam propagation angle) of the exit light from all of the semiconductor lasers 101 to 112 including the beam paths 51, 52, and 53 become the solution of formula (1). Specifically, among the semiconductor lasers 101 to 112 adjacent to each other, for example, the intervals between each of the laser light exit points from the semiconductor laser 106 to the semiconductor laser 101 are unequal when observed from the center of the semiconductor substrate 1 toward the outermost side of the semiconductor substrate 1 (stacking direction of the semiconductor lasers).

$$\theta_k = \arccos\left(\frac{m_k c}{2n_\lambda L_{etalon} f}\right)\left(\approx \sqrt{2\left(\frac{2n_\lambda L_{etalon} f}{m_k c} - 1\right)}\right) \quad (1)$$

where $\theta_k$ indicates a beam propagation angle (rad) in the etalon 3 of laser light emitted from the k-th semiconductor laser, $m_k$ indicates an order of interference (arbitrary natural number for each k), c indicates a light speed, $n_\lambda$ indicates a refractive index of the etalon 3 at a wavelength $\lambda$, $L_{etalon}$ indicates a length of the etalon 3, and f indicates an arbitrary peak frequency (which is the same for all k).

Light emitted from one semiconductor laser is collimated by the collimating lens 2 and, after transmitting through the etalon 3, the light intensity thereof is detected in the photodetector 4. The transmittance of the etalon 3 has periodic frequency dependence, so that the light intensity detected in the photodetector 4 depends on the frequency of light emitted from the semiconductor lasers 101 to 112. Therefore, if the relationship between the light intensity detected in the photodetector 4 and the frequency of light is known in advance, the wavelength (=light speed/frequency) of light output from the semiconductor laser can be monitored by monitoring the light intensity detected in the photodetector 4.

When the intra-etalon 3 beam propagation angles $\theta_k$ of the exit light from all of the semiconductor lasers 101 to 112 satisfy formula (1), the correspondence between the light intensity detected in the photodetector 4 and the frequency of light agrees with each other among all the semiconductor lasers 101 to 112, so that highly accurate wavelength monitoring is made possible.

In the followings, the principle that the correspondence between the light intensity detected in the photodetector 4 and the wavelength of light output from each of the semiconductor lasers 101 to 112 coincides with each other when formula (1) is satisfied is explained.

Figure 2:
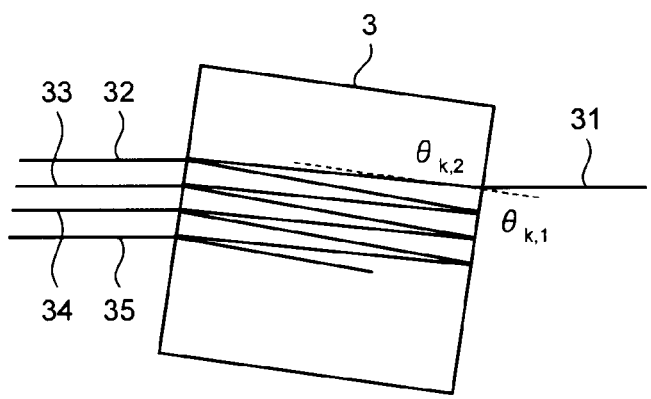
FIG. 2 is a diagram conceptually illustrating propagation of light transmitting through an etalon.

FIG. 2 is a diagram conceptually illustrating propagation of light transmitting through the etalon 3. When a beam 31 enters the etalon 3 from the right side in FIG. 2 at an incident angle $\theta_{k1}$, the beam is refracted according to Snell's law and the intra-etalon beam propagation angle becomes $\theta_{k2}$. The beam entered the etalon repeats reflection and partial transmission in the etalon. Finally, transmitted light is generated as a result of mutual interference among all exit light including beams 32, 33, 34, and 35 emitted from the exit surface (left side in FIG. 2) of the etalon 3. At this time, the frequency with which the transmitted light intensity reaches a peak is calculated based on an optical path difference $\Delta l$ of each exit light. The optical path difference $\Delta l$ is represented by formula (2). The optical path difference is a difference between an optical distance of a path along which light emitted from an emission position to the light transmission side and an optical distance of a path along which light emitted from an emission position to the light reflection side within the etalon is reflected on a reflection position and thereafter emitted to the light transmission side.

$$\Delta l = \frac{2n_\lambda L_{etalon}}{\cos\theta_{k,2}} - 2L_{etalon}\tan\theta_{k,2}\sin\theta_{k,1} \quad (2)$$

$$= 2n_\lambda L_{etalon}\cos\theta_{k,2}$$

Because lights enhance with each other when the optical path difference Δ1 is the integral multiple of the wavelength, the peak frequency of the light transmitted through the etalon (hereinafter may be referred to just as "etalon-transmitted light") is represented by formula (3).

$$f = \frac{m_k c}{2n_\lambda L_{etalon} \cos\theta_{k,2}} \quad (3)$$

$$= \frac{m_k c}{2n_\lambda L_{etalon}} \times \frac{1}{1 - \frac{1}{2}\theta_{k,2}^2 + \frac{1}{4!}\theta_{k,2}^4 - \ldots}$$

$$\approx \frac{m_k c}{2n_\lambda L_{etalon}} \times \frac{1}{1 - \frac{1}{2}\theta_{k,2}^2}$$

$$= \frac{m_k c}{2n_\lambda L_{etalon}} \times \left(\sum_{n=0}^{\infty} \left(\frac{1}{2}\theta_{k,2}^2\right)^n\right)$$

$$\approx \frac{m_k c}{2n_\lambda L_{etalon}} \times \left(1 + \frac{1}{2}\theta_{k,2}^2\right)$$

Formula (4) can be obtained by modifying the equation at the uppermost stage in formula (3) and formula (5) can be obtained by modifying the equation at the lowermost stage in formula (3).

$$\theta_k = \arccos\left(\frac{m_k c}{2n_\lambda L_{etalon} f}\right) \quad (4)$$

$$\theta_k = \sqrt{2\left(\frac{2n_\lambda L_{etalon} f}{m_k c} - 1\right)} \quad (5)$$

Each parameter in formula (3) to formula (5) is similar to formula (1). Among the parameters in formulas (3) to (5), the light speed c, the refractive index $n_\lambda$, and the etalon length $L_{etalon}$ are fixed values and the arbitrary peak frequency f does not depend on the operating semiconductor laser k, so that only $m_k$ (order of interference) is a variable. The order of interference means an integer to be multiplied with $2\pi$ in a component that is the integral multiple of $2\pi$ of a phase detected in an interference signal.

Figure 3:
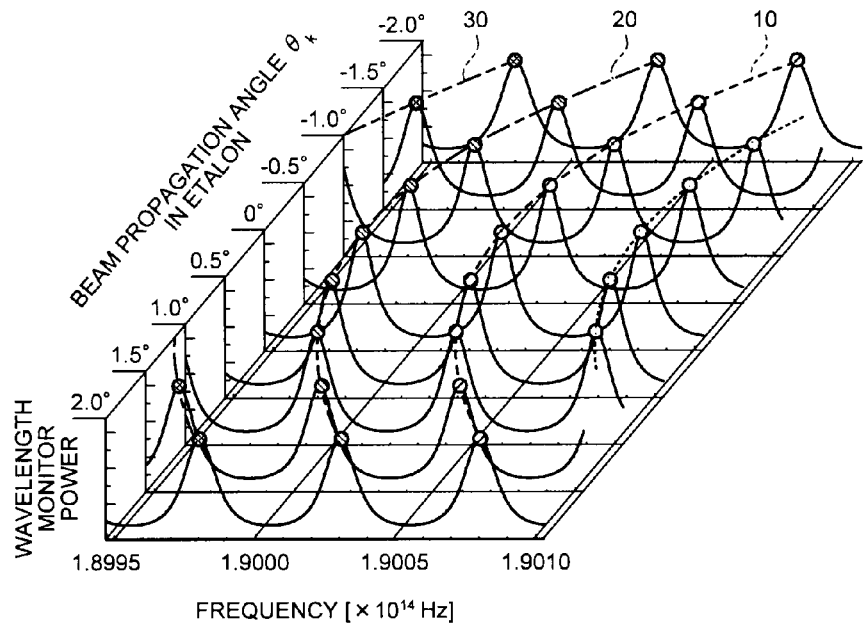
FIG. 3 is a diagram illustrating a frequency dependence of an etalon-transmitted light intensity when an intra-etalon beam propagation angle is changed.

FIG. 3 is a diagram illustrating a frequency dependence of an etalon-transmitted light intensity when the intra-etalon beam propagation angle $\theta_k$ is changed. The horizontal axis indicates the frequency, the vertical axis indicates the etalon-transmitted light intensity (wavelength monitoring power), and the axis in a depth direction indicates the intra-etalon beam propagation angle $\theta_k$. FIG. 3 illustrates dotted lines 10, 20, and 30 each of which is obtained by connecting the peaks of the same order of interference $m_k$. This is equivalent to the intra-etalon beam propagation angle $\theta_k$ dependence of the frequency f when the light speed c, the refractive index nλ, the etalon length $L_{etalon}$, and the order of interference $m_k$ in formula (3) are fixed. With reference to FIG. 3, for example, when the graph in which $\theta_k$ is 0.5 degrees and the graph in which $\theta_k$ is 2.0 degrees are compared, it is found that the peak frequencies of different orders of interference $m_k$ are approximately equivalent to each other. Specifically, in the graph in which $\theta_k$ is 2.0 degrees, the peak frequency in the dotted line 20 is around $1.9003 \times 10^{14}$ Hz, and, in the graph in which $\theta_k$ is 0.5 degrees, the peak frequency in the dotted line 10 is also around $1.9003 \times 10^{14}$ Hz. When these are expressed by using formula (3), the following formula (6) and formula (7) are obtained.

$$1.9003 \times 10^{14} \text{ Hz} \approx \frac{mc}{2n_\lambda L_{etalon}} \times \left(1 + \frac{1}{2}0.5^{\circ 2}\right) \quad (\theta_k = 0.5°) \quad (6)$$

$$1.9003 \times 10^{14} \text{ Hz} \approx \frac{(m-1)c}{2n_\lambda L_{etalon}} \times \left(1 + \frac{1}{2}2.0^{\circ 2}\right) \quad (\theta_k = 2.0°) \quad (7)$$

In the first embodiment, a calculation example is shown to illustrate the effect when the semiconductor lasers 101 to 112 are unequally spaced so that the intra-etalon 3 beam propagation angles $\theta_k$ of the exit light from all of the semiconductor lasers become the solution of formula (1).

Figure 4:
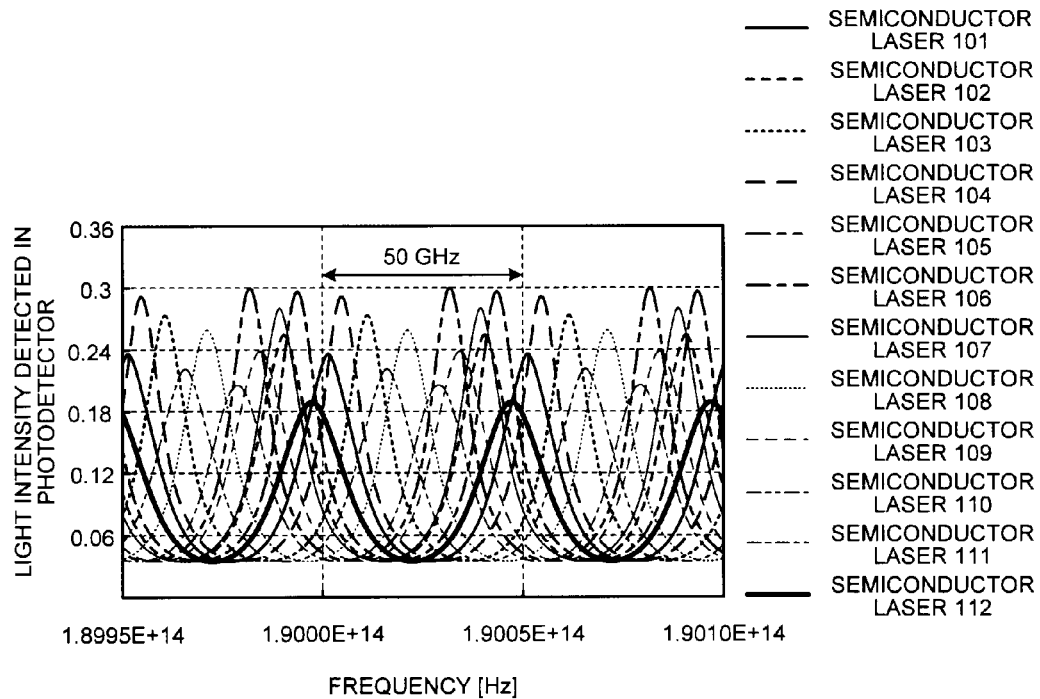
FIG. 4 is a diagram illustrating a relationship between the light intensity detected by a photodetector and the frequency of light when a semiconductor substrate on which semiconductor lasers are arranged at equal intervals is used.

FIG. 4 is a diagram illustrating a relationship between the light intensity detected in the photodetector 4 and the frequency of light when the semiconductor substrate 1 on which the semiconductor lasers 101 to 112 are arranged at equal intervals is used. FIG. 4 illustrates the relationship between the light intensity detected in the wavelength monitor configured as below and the frequency of light. Specifically, this wavelength monitor includes the semiconductor substrate 1 in which the arrangement intervals between the semiconductor lasers 101 to 112 are 20 μm (that is, the semiconductor substrate 1 on which the semiconductor lasers 101 to 112 are arranged at equal intervals), the collimating lens 2 whose lens center is located on an extension of the semiconductor laser 106, which is arranged at a position 1.0 mm away from the semiconductor laser 106, and whose focal distance is 1.0 mm, the crystal etalon 3 which is arranged such that an angle formed with the extension of the semiconductor laser 106 is 1 degree and is arranged at a position 5.0 mm away from the collimating lens 2 and whose refractive index is about 1.52, and the photodetector 4 which is arranged to be vertical to the extension of the semiconductor laser 106 at a position 2.0 mm away from the etalon 3 and is a square photodiode having a light receiving area of 250 μm².

In this wavelength monitor, the exit light from each of the semiconductor lasers 101 to 112 transmits through the collimating lens 2 and the etalon 3 and is detected in the photodetector 4. It is found from FIG. 4 that when formula (1) is not satisfied, the relationship between the light intensity detected in the photodetector 4 and the frequency of light differs for each of the operating semiconductor lasers 101 to 112. For example, focusing on the frequency of $1.90 \times 10^{14}$ Hz, the light intensity of the exit light from each of the semiconductor lasers 101 to 112 detected in the photodetector 4 differs in a range of 0.04 (for example, the semiconductor laser 108) to 0.24 (the semiconductor laser 101).

Next, a design example in which the intra-etalon beam propagation angles $\theta_k$ of the exit light from all of the semiconductor lasers 101 to 112 become the solution in formula (1) is shown in Table 1. Table 1 shows the exit position of the laser light from each of the semiconductor lasers 101 to 112 and the intra-etalon beam propagation angle $\theta_k$ at that time. In other words, Table 1 shows one example of the exit position of each laser light when the semiconductor lasers 101 to 112 are arranged so that the intra-etalon 3 beam propagation angle $\theta_k$ of the laser light (exit light) emitted from each of the semiconductor lasers 101 to 112 becomes the solution (predetermined angle) in formula (1).

TABLE 1

| | Semiconductor laser | | | | | | | | | | | |
|---|---|---|---|---|---|---|---|---|---|---|---|---|
| | 101 | 102 | 103 | 104 | 105 | 106 | 107 | 108 | 109 | 110 | 111 | 112 |
| LD exit position [μm] | −81.29 | −73.14 | −63.96 | −53.22 | −39.67 | −17.75 | 17.75 | 39.67 | 53.22 | 63.96 | 73.14 | 81.29 |
| Intra-etalon beam propagation angle [°] | −4.633 | −4.169 | −3.646 | −3.033 | −2.261 | −1.012 | 1.012 | 2.261 | 3.033 | 3.646 | 4.169 | 4.633 |

When the center of the semiconductor substrate 1 in the pitch direction (that is, the direction toward the outermost sides) of the semiconductor lasers 101 to 112 is, for example, between the semiconductor lasers 106 and 107, the position of −17.75 μm from this center becomes the position of the laser light exit point (hereinafter referred to "laser light exit point position") of the semiconductor laser 106 and the position of 17.75 μm from this center becomes the laser light exit point position of the semiconductor laser 107. In the similar manner, for example, the position of −39.67 μm from the center of the semiconductor substrate 1 becomes the laser light exit point position of the semiconductor laser 105 and the position of −39.67 μm from the center of the semiconductor substrate 1 becomes the laser light exit point position of the semiconductor laser 108. Furthermore, the distance between the laser light exit point position of the semiconductor laser 105 and the laser light exit point position of the semiconductor laser 106 is 21.92 μm, the distance between the laser light exit point position of the semiconductor laser 104 arranged outside the semiconductor laser 105 and the laser light exit point position of the semiconductor laser 105 is 13.55 μm narrower than 21.92 μm.

Figure 5:
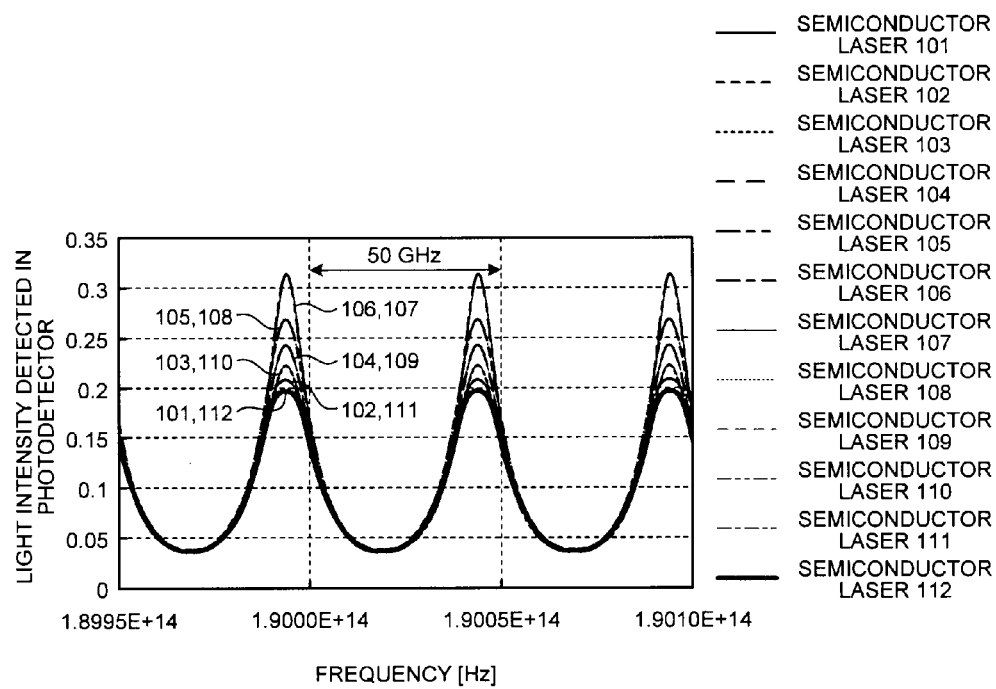
FIG. 5 is a diagram illustrating a wavelength dependency of the light intensity detected by the photodetector when the semiconductor lasers are arranged as shown in Table 1.

FIG. 5 is a diagram illustrating a wavelength dependence of the light intensity detected in the photodetector 4 when the semiconductor lasers 101 to 112 are arranged as shown in Table 1. FIG. 5 illustrates the light intensity of each exit light, which is emitted from the semiconductor lasers 101 to 112 arranged on the semiconductor substrate 1 under the condition of Table 1 transmitted through the collimating lens 2 and the etalon 3, and detected in the photodetector 4. The collimating lens 2, the etalon 3, and the photodetector 4 are set in the similar manner to the setting of FIG. 4. It is understood from FIG. 5 that when formula (1) is satisfied, the relationships between the light intensity of the light from each of the operating semiconductor lasers 101 to 112 detected in the photodetector 4 and the frequency of the light thereof coincide with each other. For example, focusing on the frequency of $1.90 \times 10^{14}$ Hz, the light intensities of the light from the semiconductor lasers 101 to 112 detected in the photodetector 4 approximately match at 0.17. Therefore, the wavelength monitor according to the present embodiment can improve the monitoring accuracy of the wavelength of light compared with the conventional technology.

In the followings, other effects are explained. According to the optical module in the first embodiment of the present invention, as shown in Table 1, at least one pair of angles among the intra-etalon beam propagation angles $\theta_k$ (that is, the solutions in formula (1)) of the exit light from each of the semiconductor lasers 101 to 112 is symmetric with respect to zero. For example, the intra-etalon beam propagation angle $\theta_k$ corresponding to the exit point position of the semiconductor laser 105 and the intra-etalon beam propagation angle $\theta_k$ corresponding to the exit point position of the semiconductor laser 108 shown in Table 1 are symmetrical to each other.

With such a structure, the adjustment operation can be facilitated by driving a pair of symmetrical semiconductor lasers and actively performing positioning of the collimating lens 2.

Specially, the collimating lens 2 can be positioned accurately by designing such that signs of the intra-etalon beam propagation angles $\theta_k$ of the exit light from the outermost side semiconductor lasers 101 and 112 are symmetric with respect to zero. The reason for this phenomenon is as follows. For example, while the intra-etalon beam propagation angles $\theta_k$ of the exit light from each of the semiconductor lasers 106 and 107 arranged on the innermost side are −1.012 and 1.012, respectively, the intra-etalon beam propagation angles $\theta_k$ of the exit light from the semiconductor lasers 101 and 112 are equal to or more than four times thereof. In performing positioning for aligning the center of the collimating lens 2 with the center of the semiconductor substrate 1 in the pitch direction of the semiconductor lasers 101 to 112, when intra-etalon beam propagation angle $\theta_k$ is larger, the positioning can be performed accurately.

Moreover, as shown in Table 1, by setting the intra-etalon beam propagation angles $\theta_k$ of the exit light from all of the semiconductor lasers 101 to 112 to ±1.0 degree or more, the ratio of the light returning to the semiconductor lasers 101 to 112 after being reflected from the surface of the etalon 3 can be about −50 dB or less. Consequently, oscillation of the semiconductor lasers 101 to 112 in multiple modes due to the return light can be suppressed.

It is to be noted that the numerical values, the shapes, the materials, the positional relationship of the semiconductor substrate 1, the collimating lens 2, the etalon 3, and the photodetector 4 are not limited to the first embodiment. In the semiconductor substrate 1 shown in the present embodiment, 12 semiconductor lasers are arranged, however, it is not limited to 12 and may be less than 12 (for example, 4, 8, or the like) or more than 12. Moreover, the focal distance of the collimating lens 2 is not necessarily 1.0 mm, and the material of the etalon 3 is not limited to crystal and may be quartz and the etalon 3 may be an air gap etalon. Furthermore, since it suffices that the etalon 3 is a filter having a periodic frequency dependence of the transmittance, the etalon 3 may be, for example, a resonator formed on a semiconductor substrate such as Si, GaAs, or InP, or a polymer or glass substrate. The photodetector 4 does not need to be a square photodiode having a light receiving area of 250 μm², and the light receiving area may be more than or less than 250 μm² and, for example, a rectangular or circular light receiving unit may be employed other than the square light receiving unit.

Moreover, in the present embodiment, the semiconductor lasers 101 to 112 are designed to have unequal intervals so that the intra-etalon 3 beam propagation angles $\theta_k$ of the exit light from all of the semiconductor lasers including the beam paths 51, 52, and 53 become the solution of formula (1). However, the intra-etalon 3 beam propagation angles $\theta_k$ of the exit light from all of the semiconductor lasers including the beam paths 51, 52, and 53 may be set so as to become the solution of formula (1) by other methods, for example, by equally spacing the semiconductor lasers 101 to 112 and appropriately designing the shape of the collimating lens 2.

As explained above, the wavelength monitor according to the present embodiment includes the semiconductor substrate 1, one or more pairs of the semiconductor lasers 101 to 112 that are formed in parallel on the semiconductor substrate 1 and are capable of arbitrary changing the wavelength of exit light, the collimating lens 2 for collimating the laser light emitted from the semiconductor lasers 101 to 112, the filter (the etalon 3) that is arranged so that collimated light enters and has a periodicity, and the photodetector 4 that receives the collimated light transmitted through the filter and detects the light intensity, and the intra-filter beam propagation angles of the exit light from the semiconductor lasers are set to become the solution of the formula (1), so that the relationships between the light intensity of the light from each of the operating semiconductors 101 to 112 detected in the photodetector 4 and the frequency of the light thereof approximately agree with each other as shown in FIG. 5, enabling to improve the monitoring accuracy of the wavelength of light.

Second Embodiment

Figure 6:
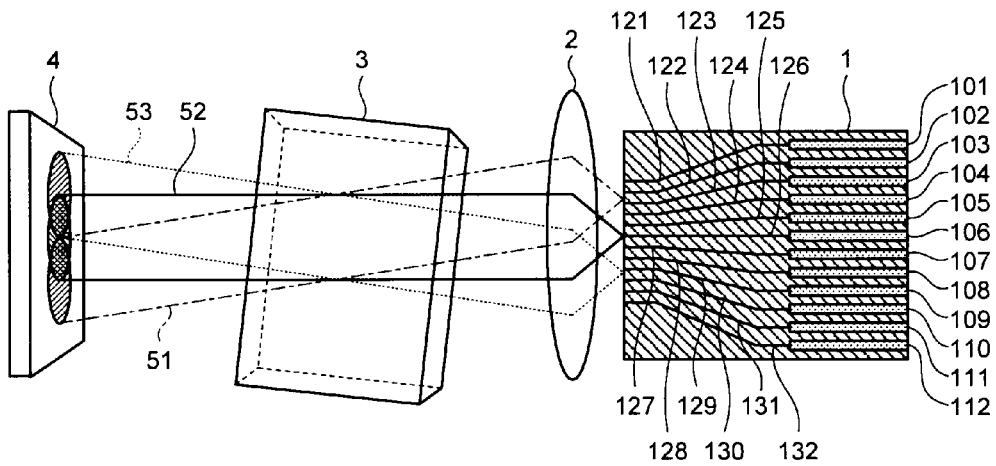
FIG. 6 is a diagram illustrating a configuration of a wavelength monitor according to a second embodiment of the present invention.

FIG. 6 is a diagram illustrating a configuration of a wavelength monitor according to the second embodiment of the present invention. The wavelength monitor shown in FIG. 6 includes the semiconductor substrate 1, two or more semiconductor lasers 101 to 112 formed in parallel on the semiconductor substrate 1, optical waveguides 121 to 132 that function to confine light in a small area and guide the light in a specific direction, the collimating lens 2 that collimates diffused light emitted from the optical waveguides 121 to 132 into parallel light, a filter, for example, the etalon 3, which is arranged in the backward direction of the semiconductor substrate 1 so that the collimated light transmitted through the collimating lens 2 enters and has a periodic frequency dependence of the transmittance, and the photodetector 4 that receives the light transmitted through the etalon 3 and detects the light intensity. The optical waveguides 121 to 132 are arranged such that the position at which light is emitted from the semiconductor substrate 1 satisfies formula (1).

Although a predetermined or more pitch interval needs to be secured between the semiconductor lasers 101 to 112 due to the structural constraint, the pitch intervals between the optical waveguides 121 to 132 can be made narrower than the pitch intervals between the semiconductor lasers 101 to 112, so that intervals between each of the exit points of light emitted from the semiconductor lasers 101 to 112 can be made narrow by providing the optical waveguides 121 to 132 on the semiconductor substrate 1.

Moreover, the semiconductor lasers 101 to 112 themselves can be set at equal intervals by providing the optical waveguides 121 to 132 for adjusting the pitches between the emission points. The angle between the exit portions of the optical waveguides 121 to 132 and the end surface of the semiconductor substrate 1 may be vertical or 70 degrees or less. When the angle is 70 degrees or less, light reflected from the end surface of the semiconductor substrate 1 to the semiconductor lasers 101 to 112 can be reduced and therefore the operation of the semiconductor lasers 101 to 112 can be stabilized.

Moreover, in the present embodiment, the exit positions of the optical waveguides 121 to 132 are designed to have unequal intervals so that the intra-etalon beam propagation angles $\theta_k$ of the exit light from all of the semiconductor lasers 101 to 112 including the beam paths 51, 52, and 53 become the solution of formula (1). However, this is not limited to the present embodiment and, for example, the above effect may be realized by appropriately designing the exit angles of the optical waveguides 121 to 132.

Third Embodiment

Figure 7:
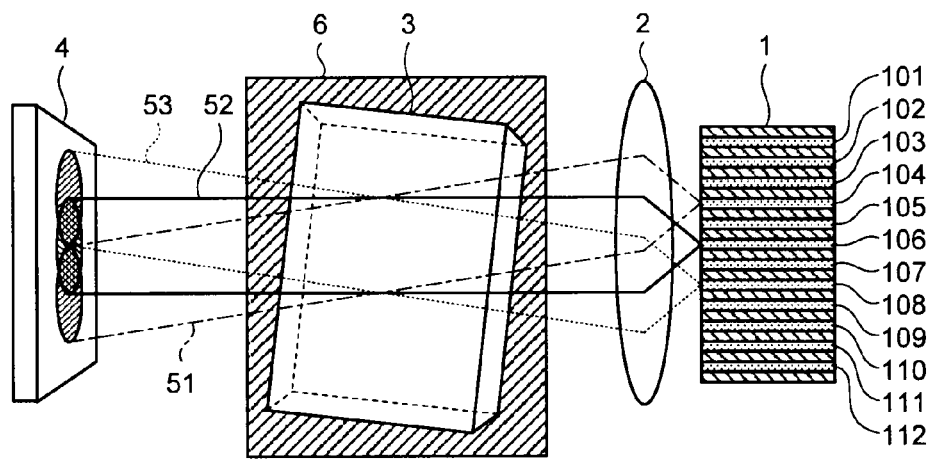
FIG. 7 is a diagram illustrating a configuration of a wavelength monitor according to a third embodiment of the present invention.

FIG. 7 is a diagram illustrating a configuration of a wavelength monitor according to the third embodiment of the present invention. The present embodiment is a modified example of the first and second embodiments, wherein the wavelength monitor includes the semiconductor substrate 1, two or more semiconductor lasers 101 to 112 formed in parallel on the semiconductor substrate 1, the optical waveguides 121 to 132 (not shown, as can be optional and have the same structure as those shown in FIG. 6) that function to confine light beam in a small area and guide the light in a specific direction, the collimating lens 2 that collimates diffused light emitted from the optical waveguides 121 to 132 into parallel light, a filter, for example, the etalon 3, which is arranged in the backward direction of the semiconductor substrate 1 so that the collimated light transmitted through the collimating lens 2 enters and has a periodic frequency dependence of the transmittance, the photodetector 4 that receives the light transmitted through the etalon 3 and detects the light intensity, and a peltier element 6 capable of controlling the temperature, and wherein the etalon 3 is provided on the peltier element 6.

When manufacturing the wavelength monitor according to the first and second embodiments, it is expected that variation occurs depending on the manufacturing accuracy. According to the wavelength monitor in the third embodiment, degradation of the wavelength monitoring characteristics due to this manufacturing variation is suppressed and the manufacturing variation can be compensated by appropriately controlling the temperature of the etalon. Specifically, the allowable misalignment of the collimating lens 2 becomes about ±2.5 μm by controlling the temperature of the etalon 3 in the range of ±20° C. This controllable range of the etalon temperature is not limited to ±20° C.

Fourth Embodiment

Figure 8:
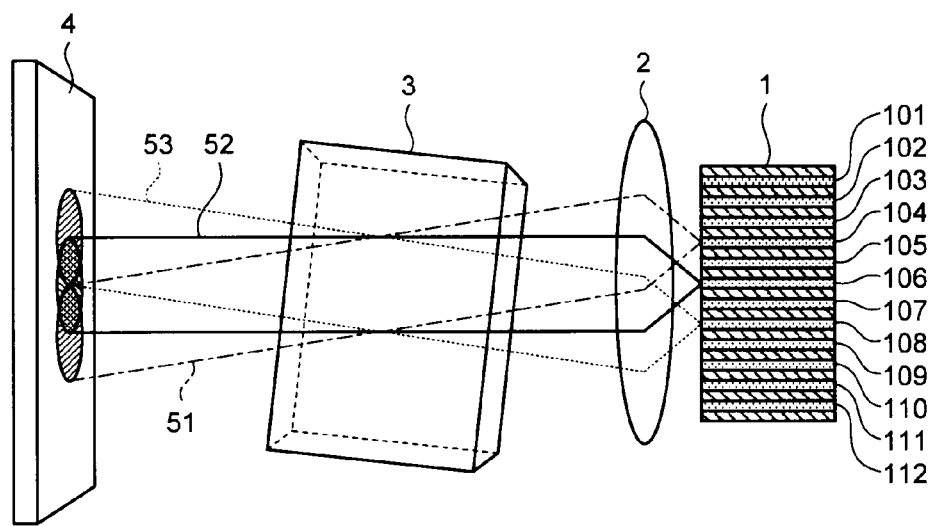
FIG. 8 is a diagram illustrating a configuration of a wavelength monitor according to a fourth embodiment of the present invention.

FIG. 8 is a diagram illustrating a configuration of a wavelength monitor according to the fourth embodiment of the present invention. The present embodiment is a modified example of the first, second, and third embodiments, and is characterized in that the light receiving portion of the photodetector 4 has a rectangular shape in which the direction that the semiconductor lasers 101 to 112 are arranged in parallel is a long side (longitudinal direction). Specifically, the longitudinal direction of the photodetector 4 is formed in the pitch direction of the semiconductor lasers 101 to 112. When the number of the integrated semiconductor lasers 101 to 112 on the semiconductor substrate 1 increases, the eccentricity of the semiconductor lasers 101 and 112 positioned outermost becomes large with respect to the collimating lens 2, so that the propagation angle of collimated light becomes large. Even collimated light having a large propagation angle can be detected in the photodetector 4 by forming the photodetector 4 in such a way as to have the above structure.

Fifth Embodiment

Figure 9:
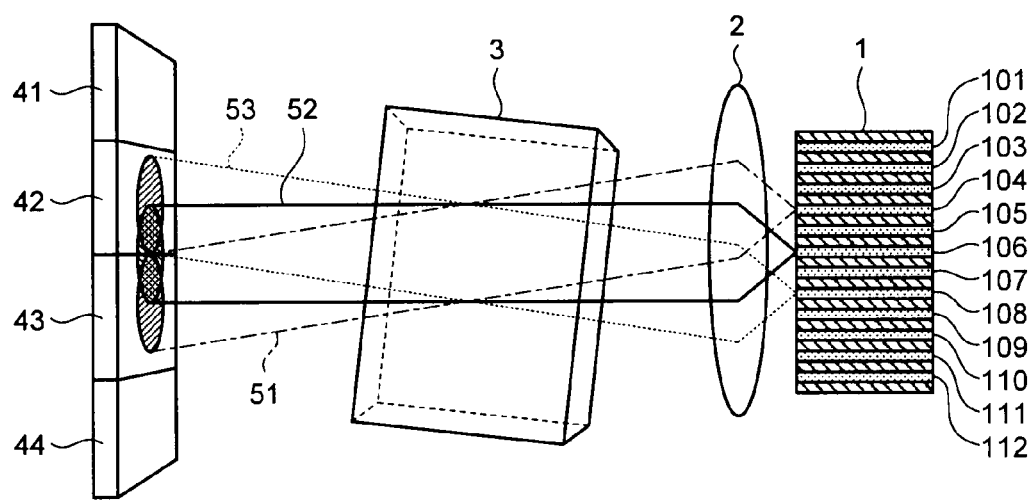
FIG. 9 is a diagram illustrating a configuration of a wavelength monitor according to a fifth embodiment of the present invention.

FIG. 9 is a diagram illustrating a configuration of a wavelength monitor according to the fifth embodiment of the present invention. The present embodiment is a modified example of the first, second, and third embodiments, and the light detecting unit according to the present embodiment has a structure in which a plurality of photodetectors 41 to 44 are arranged in an array in the same direction as the pitch direction of the semiconductor lasers 101 to 112. When the number of the integrated semiconductor lasers 101 to 112 on the semiconductor substrate 1 increases, the eccentricity of the semiconductor lasers 101 and 112 positioned at the outermost side becomes large with respect to the collimating lens 2, so that the propagation angle of collimated light becomes large. Even collimated light having a large propagation angle can be detected in the photodetectors 41 to 44 by forming the light detecting unit in such a manner as to have the above structure. In the fifth embodiment, the number of the photodetectors is four as an example, however, is not limited to this number and can be appropriately set according to the propagation angle of collimated light.

The wavelength monitor explained in the first to fifth embodiments each illustrates one example of the content of the present invention, and it is needless to say that the wavelength monitor can be combined with a different publicly known technology and can be modified, for example, by omitting some part thereof, without departing from the gist of the present invention.

As explained heretofore, according to the present invention, the intra-filter beam propagation angles of the exit light from a plurality of the semiconductor lasers are set to become the solution of formula (1), so that such an effect is obtained that variation in the wavelength monitoring characteristics of laser light emitted from the semiconductor lasers in a backward direction can be suppressed.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A wavelength monitor that monitors a wavelength of laser light emitted from at least two semiconductor lasers formed in parallel on a semiconductor substrate; comprising:
    a lens that collimates laser light from each of the semiconductor lasers;
    a filter that is arranged so that laser light collimated by the lens is capable of entering and has a periodicity; and
    a photodetector that receives laser light transmitted through the filter and detects a light intensity, wherein
    an intra-filter beam propagation angle of laser light emitted from each of the semiconductor lasers becomes a predetermined angle obtained by the following formula:

$$\theta_k = \arccos\left(\frac{m_k c}{2 n_\lambda L_{etalon} f}\right) \left(\approx \sqrt{2\left(\frac{2 n_\lambda L_{etalon} f}{m_k c} - 1\right)}\right)$$

where f indicates an arbitrary peak frequency, $m_k$ indicates an order of interference which is an arbitrary natural number for each k, c indicates a light speed, $n_\lambda$ indicates a refractive index of the filter at a wavelength $\lambda$, $L_{etalon}$ indicates a length of the filter, and $\theta_k$ indicates an intra-filter beam propagation angle (rad) of laser light emitted from a k-th semiconductor laser.

2. The wavelength monitor according to claim 1, wherein
    the semiconductor lasers are arranged on the semiconductor substrate in a stacked manner from a center of the semiconductor substrate toward the outermost sides of the semiconductor substrate,
    intervals between laser light exit points of the semiconductor lasers adjacent to each other are unequal from the center of the semiconductor substrate toward the outermost sides of the semiconductor substrate, and
    the intra-filter beam propagation angle of laser light emitted from each of the semiconductor lasers becomes the solution of the formula.

3. The wavelength monitor according to claim 1, further comprising at least two optical waveguides, which convert an exit position of laser light emitted in the backward direction of the semiconductor substrate from each of the semiconductor lasers, formed on the semiconductor substrate, wherein
    intervals between exit portions of the optical waveguides are unequal from a center of the semiconductor substrate toward the outermost sides of the semiconductor substrate, and
    the intra-filter beam propagation angle of laser light emitted from each of the semiconductor lasers becomes a predetermined angle obtained by the formula.

4. The wavelength monitor according to claim 3, wherein an angle between the exit portion of each of the optical waveguides and an end surface of the semiconductor substrate is 70 degrees or less.

5. The wavelength monitor according to claim 1, further comprising at least two optical waveguides, each of which convert an exit position of laser light emitted backwardly of the semiconductor substrate from the semiconductor lasers, formed on the semiconductor substrate, wherein
    the intra-filter beam propagation angle of laser light emitted from each of the semiconductor lasers becomes a predetermined angle obtained by the formula, by setting an exit angle of each of the optical waveguides to a predetermined angle.

6. The wavelength monitor according to claim 1, wherein a surface shape of the lens is designed such that the intra-filter beam propagation angle of laser light emitted from each of the semiconductor lasers becomes a predetermined angle obtained by the formula.

7. The wavelength monitor according to claim 1, wherein
    the intra-filter beam propagation angle of laser light emitted from each of the semiconductor lasers becomes a predetermined angle obtained by the formula, and
    at least a pair of angles among the intra-filter beam propagation angles is symmetric with respect to zero.

8. The wavelength monitor according to claim 1, wherein
    the intra-filter beam propagation angle of laser light emitted from each of the semiconductor lasers becomes a predetermined angle obtained by the formula, and
    signs of intra-filter beam propagation angles of laser light emitted from the outermost two semiconductor lasers are opposite to each other, and are symmetric with respect to zero.

9. The wavelength monitor according to claim 1, wherein the intra-filter beam propagation angle of laser light emitted from each of the semiconductor lasers becomes a predetermined angle obtained by the formula and is 1 degree or more.

10. The wavelength monitor according to claim 1, further comprising a temperature control element that controls a temperature of the filter, wherein
the filter is provided on the temperature control element.

11. The wavelength monitor according to claim 1, wherein the photodetector is formed into a rectangle in which the direction in which the semiconductor lasers are arranged in parallel is a longitudinal direction.

12. The wavelength monitor according to claim 1, wherein the photodetector includes at least two photodetectors, and the photodetectors are composed of and arranged in an array in a direction in which the semiconductor lasers are arranged in parallel.

13. The wavelength monitor according to claim 1, wherein the filter is a quartz etalon.

14. The wavelength monitor according to claim 1, wherein the filter is a crystal etalon.

* * * * *